US007935292B2

(12) United States Patent
Sreenivasan et al.

(10) Patent No.: US 7,935,292 B2
(45) Date of Patent: May 3, 2011

(54) IMPRINTING OF PARTIAL FIELDS AT THE EDGE OF THE WAFER

(75) Inventors: Sidlgata V. Sreenivasan, Austin, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/479,437

(22) Filed: Jun. 5, 2009

(65) Prior Publication Data

US 2009/0283934 A1  Nov. 19, 2009

Related U.S. Application Data

(63) Continuation of application No. 11/694,500, filed on Mar. 30, 2007, now Pat. No. 7,802,978.

(51) Int. Cl.
*B29C 59/02* (2006.01)
(52) U.S. Cl. .................................... 264/293; 425/385
(58) Field of Classification Search ............... 264/293; 425/385
See application file for complete search history.

(56) References Cited

U.S. PATENT DOCUMENTS

| | | | | |
|---|---|---|---|---|
| 5,110,665 | A * | 5/1992 | Titterington | 428/32.13 |
| 5,622,747 | A * | 4/1997 | Todd et al. | 438/759 |
| 6,103,445 | A * | 8/2000 | Willson et al. | 430/270.1 |
| 2005/0020087 | A1* | 1/2005 | Wagner et al. | 438/700 |
| 2005/0184436 | A1* | 8/2005 | Jeong et al. | 264/496 |
| 2005/0250052 | A1* | 11/2005 | Nguyen | 430/322 |
| 2007/0102844 | A1* | 5/2007 | Simon et al. | 264/259 |
| 2007/0141191 | A1* | 6/2007 | Kruijt-Stegeman et al. | 425/174.4 |
| 2007/0200276 | A1* | 8/2007 | Mackey et al. | 264/293 |

* cited by examiner

*Primary Examiner* — Richard Crispino
*Assistant Examiner* — Robert Dye

(57) ABSTRACT

Edge field patterning of a substrate having full fields and partial fields may include patterning using a template having multiple mesas with each mesa corresponding to a field on the substrate. Polymerizable material may be deposited solely between the template and the full fields of the substrate. A non-reactive material may be deposited between the template and partial fields of the substrate.

19 Claims, 6 Drawing Sheets

IMPRINTING OF PARTIAL FIELDS AT THE EDGE OF THE WAFER

This application is a Continuation of U.S. patent application Ser. No. 11/694,500 filed Mar. 30, 2007, which claims benefit to U.S. provisional application 60/788,781 filed on Apr. 3, 2006; both of which are hereby incorporated by reference herein.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194 filed as U.S. patent application Ser. No. 10/235,314, entitled "Functional Patterning Material for Imprint Lithography Processes," all of which are assigned to the assignee of the present invention and all of which are incorporated by reference herein.

An imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

DETAILED DESCRIPTION

Figure 1:
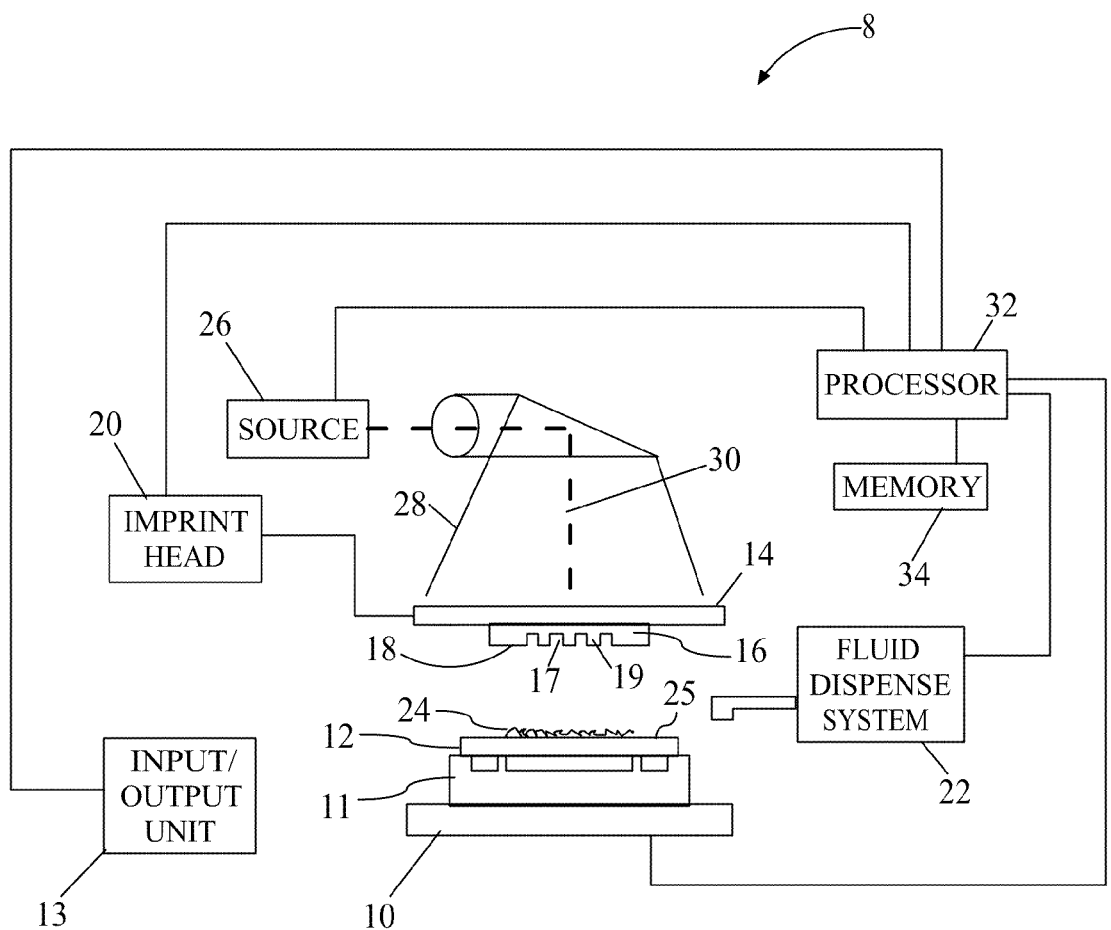
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymerizable material 24 thereon. It should be understood that polymerizable material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymerizable material 24.

Typically, polymerizable material 24 is disposed upon substrate 12 before the desired volume is defined between mold 16 and substrate 12. However, polymerizable material 24 may fill the volume after the desired volume has been obtained. After the desired volume is filled with polymerizable material 24, source 26 produces energy 28, e.g., broadband energy that causes polymerizable material 24 to solidify and/or cross-link conforming to the shape of a surface 25 of substrate 12 and patterning surface 18, defining a patterned layer 50 on substrate 12.

The broadband energy may comprises an actinic component including, but not limited to, ultraviolet wavelengths, thermal energy, electromagnetic energy, visible light and the like. The actinic component employed typically depends on the material from which imprinting layer 12 is formed. Control of this process is regulated by a processor 32 that is in data communication with stage 10, imprint head 20, fluid dispense system 22, source 26, operating on a computer readable program stored in memory 34.

The above-mentioned may be further employed in imprint lithography processes and systems referred to in U.S. Pat. No. 6,932,934 entitled "Formation of Discontinuous Films During an Imprint Lithography Process" and United States patent application publication 2004/0124566, filed as U.S. patent application Ser. No. 10/194,991 entitled "Step and Repeat Imprint Lithography Processes," both of which are incorporated by reference herein.

The present invention involves problems associated with imprinting the edge fields and dies. Since partial fields that contain full die lead to yielding devices, it is important that the performance of the yielding die be as good as inner die in a wafer. Therefore, even if only one edge or a corner of the field is on the wafer, there should be as many alignment marks as possible in these locations to maximize alignment performance. It is good to have alignment of X, Y and theta and ensure that mag_x, mag_y and ortho errors are not changing from the previous inner field to the edge field; then the overlay performance will work well. The 8 channel i-MAT and i-MAT design, noted herein, that allows for very high flexibility in alignment mark location may be used on the tool to allow this. An example of a magnification correction is described in U.S. patent application Ser. No. 11/142,839 entitled "Apparatus to Vary Dimensions of a Substrate during Nano-Scale Manufacturing" and U.S. patent application Ser. No. 11/142,834 entitled "Method of Varying Dimensions of a Substrate during Nano-Scale Manufacturing," both of which are incorporated by reference herein.

Figure 2A:
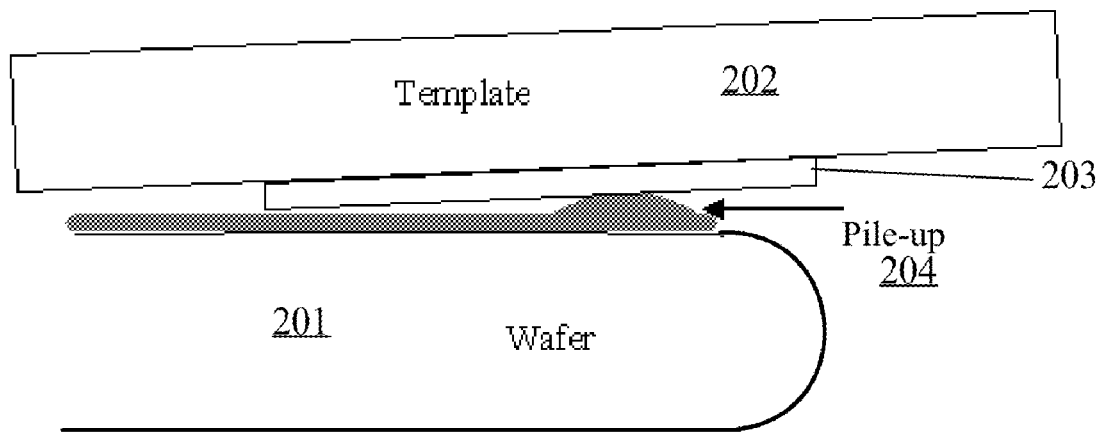
FIG. 2A illustrates an edge bead on a wafer.
Figure 2B:
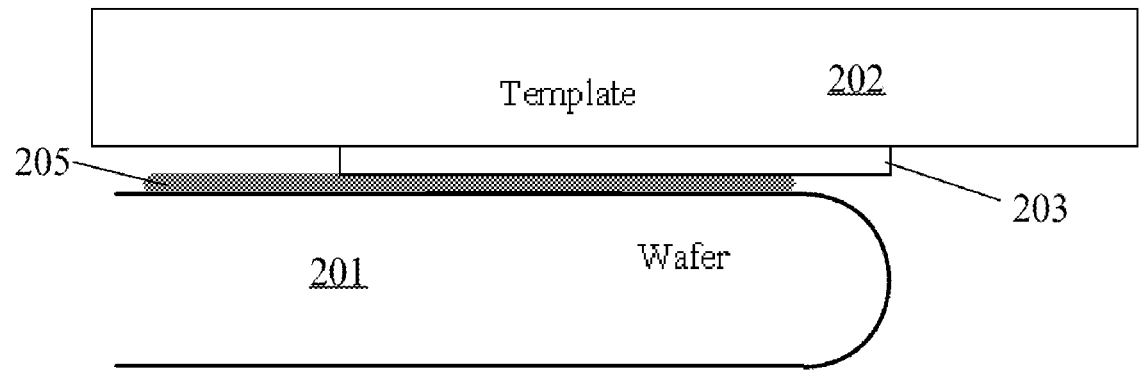
FIG. 2B illustrates absence of an edge bead on a wafer.

The transfer layer (such as BARC) that is used as an adhesion promoter is spin coated onto the wafers prior to imprinting. During the spin coating process, spin-coating material wets the edge of the wafer, which leads to wafer edge contamination. Therefore, a thin boundary of the transfer layer needs to be removed, typically using a type of solvent (wet edge bead removal process, such as disclosed in U.S. Pat. No. 6,494,221 which is hereby incorporated by reference herein. This can lead to a material pile up at the edge due to the edge bead removal process. If this pile up is higher than 100 or 200 nm, or for some imprint processes even as high as 50 nm, it can cause difficulty in edge field printing. FIG. 2A illustrates an example of such a pile up of spin-on material on a wafer 201. As can be seen, the template 202 with the active imprinting area 203 is caused to be tilted up due to the pile up 204 at the edge of the wafer 201. Therefore, the transfer layer material should be designed such that its edge beam is removable without any pile up. Therefore, an optically imageable material that can be developed to eliminate the edge bead 204 is desirable. FIG. 2B illustrates the imprinting of a template 202 upon the material 205 in a proper configuration in the absence of a pile up of material, such as shown in FIG. 2A. The material can be a positive tone resist (the regions exposed to photons go away in the develop step) or it can be negative tone wherein the entire wafer except for the edge bead is exposed to the photons. An example of a positive tone photoresist that will be applicable for this situation is i-line resist available under the name ULTRA-i™ 123 available from Rohm and Haas's located in Philadelphia, Pa.

Figure 3:
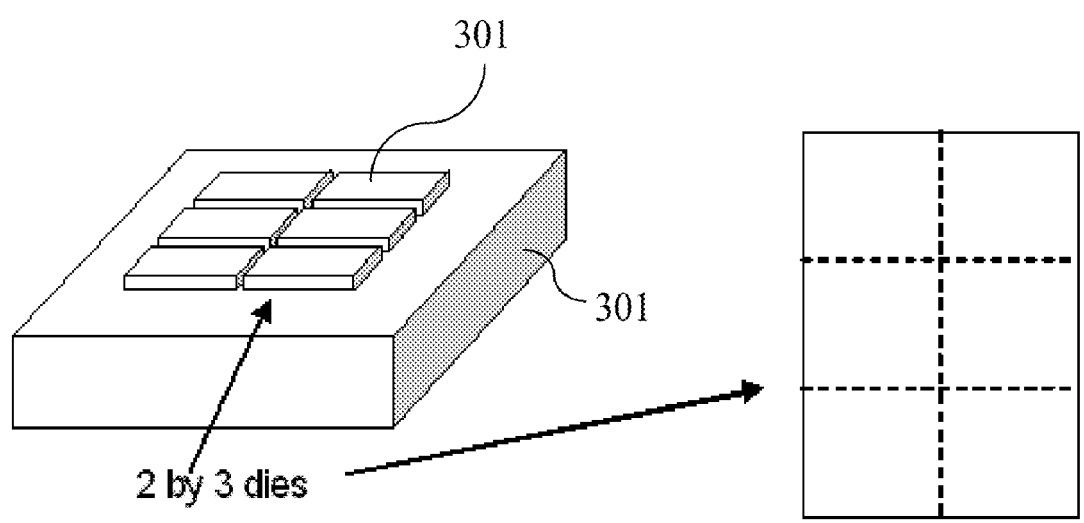
FIG. 3 is a perspective view of a template having each die located on a separate mesa to confine imprint liquid to a specific die during edge field printing.

Referring to FIG. 3, the template 300 may be designed in such a way that it has each die 301 located on its own mesa to confine the imprint liquid to specific die during edge field printing. When printing an edge field that has at least one full die, the template mesas that include the full die can receive the imprint liquid, while the partial die may receive a non-reactive liquid such as isopropanol to avoid the template from making direct contact with the substrate. An example of a template is described in U.S. Pat. No. 6,696,220 entitled "Template for Room Temperature, Low Pressure Micro-and Nano-Imprint Lithography," which is incorporated by reference herein.

Figure 4:
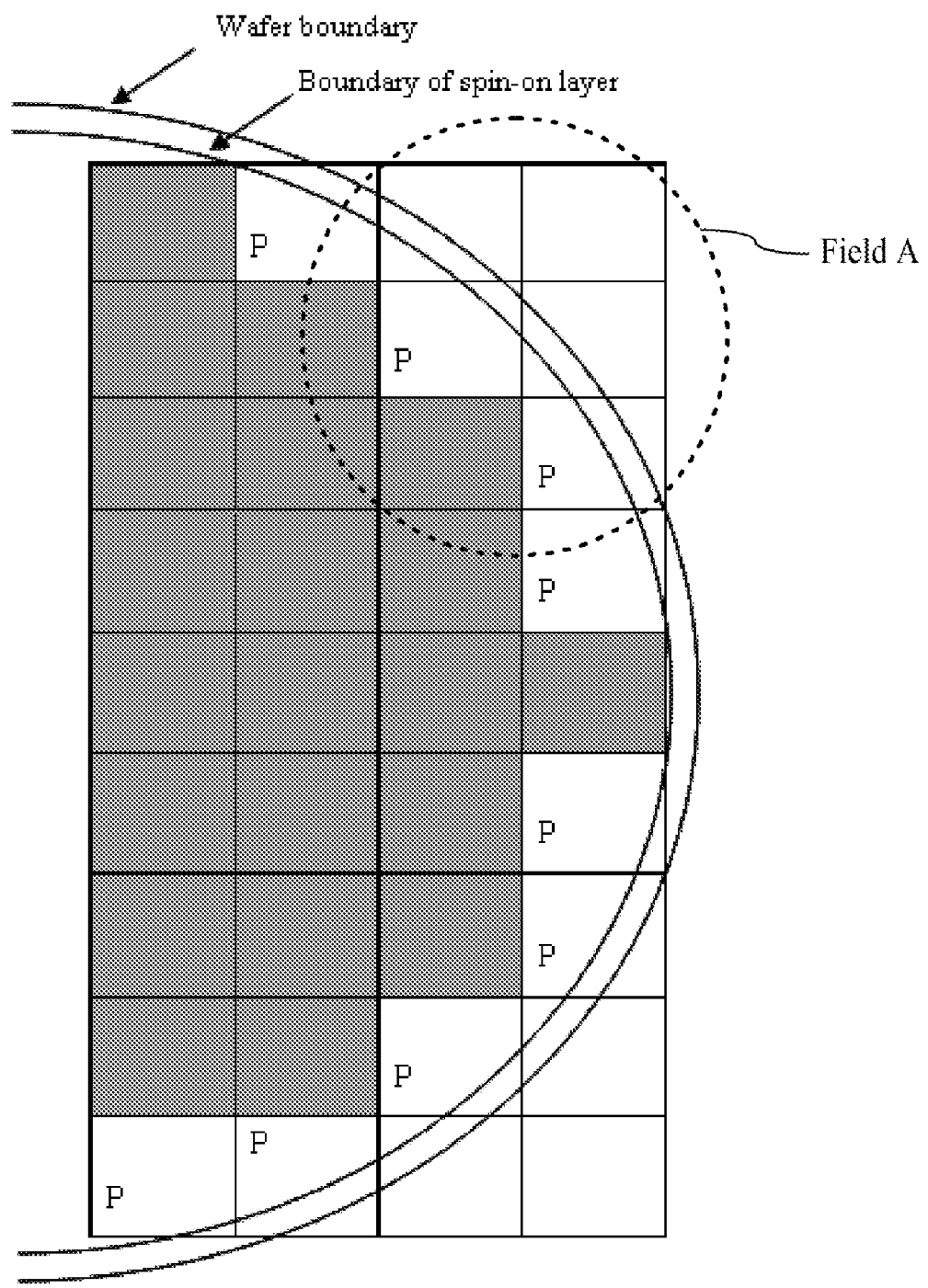
FIG. 4 is a schematic of litho fields at the edge of a substrate having only full dies (shaded) filled with imprinting fluid.

Referring to FIG. 4, there is illustrated an example of imprinting where only full dies (the shaded ones) are filled with imprinting fluid. In this case, all imprint fields are potentially yieldable and a stepped imprint boundary is formed. As compared to this case, it is necessary to cover the entire surface of the wafer even if some dies are not yieldable. In this case, all partial dies, noted with "P" in FIG. 4 will be imprinted while their fluid areas are defined by the combination of the die mesa and underlying layer boundary, which results in a circular imprinted boundary.

Figure 5:
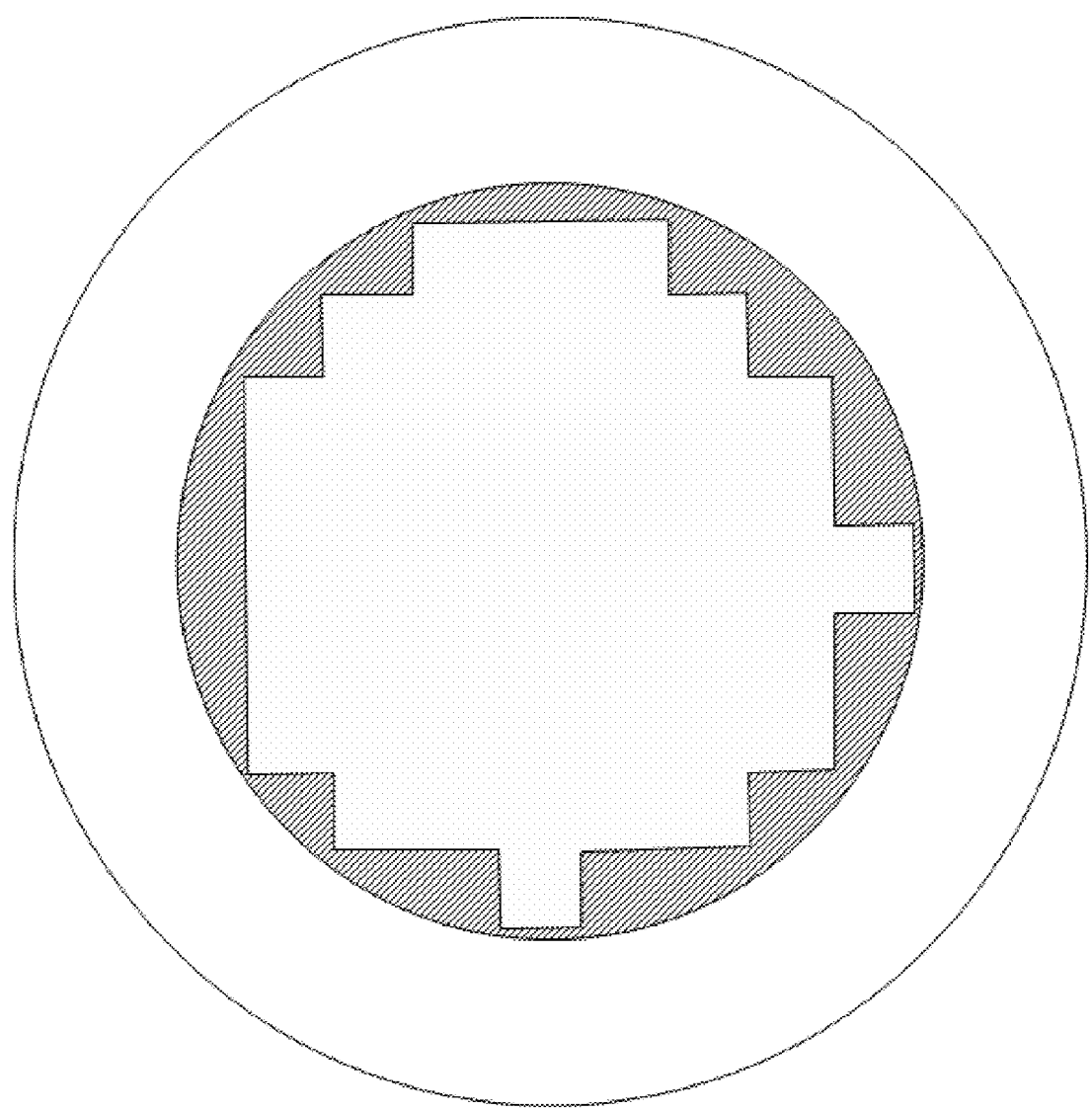
FIG. 5 is a schematic of a template for imprinting of partial litho fields on a substrate.

Referring to FIG. 5, optionally, all the partial dies can be imprinted simultaneously with a large area template. Since these dies do not read to yielding devices, a large template that is "die layout specific" and that is specifically designed to have mesas only in the partial die regions can be used. Such a template would have regions outside and inside the partial die regions as etched back and no imprint liquid would be placed in the etched back regions. Since these dies do not yield, their overlay performance is not optical. Further, they do not have to have expensive, high resolution features in the large area templates. For example, the patterns can be chosen such that it has comparable pattern density variation to the high-resolution version, but only has features >400 nm to allow laser patterning. The similar pattern density should assist in avoiding undesirable etch and CMP loading effects. An example of a large area process is described in United States patent application publication 2005/0189676, filed as U.S. patent application Ser. No. 10/788,700, entitled "Full-Wafer or Large Area Imprinting with Multiple Separated Sub-Fields for High Throughput Lithography" which is incorporated by reference herein.

Alternatively, the fluid dispense has to be very accurate to allow liquid to be placed only over the region the full die and the partial die exist on the wafer (excluding the annular exclusion zone of the wafer). Care should be taken to tailor the drop dispense at the wafer edge to substantially avoid liquid from wetting the template that is hanging out beyond the edge of the wafer. For example, it has been found that long lines and gratings tend to draw liquid along them beyond the boundary of the wafer. This phenomenon does not occur as readily if the features at the edge of the wafer are holes on the templates. Therefore, lower amounts of liquid should be placed in pattern areas that tend to draw liquid beyond the edge of the wafer such as gratings.

Figure 6:
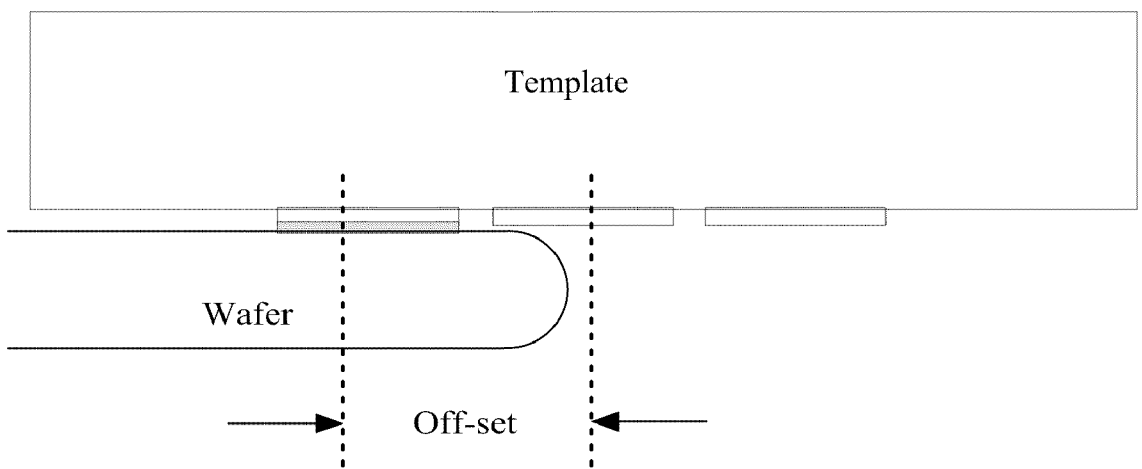
FIG. 6 is a simplified side view of a portion of a template positioned in superimposition with a substrate such that during imprinting of a single die on the substrate, a pressure center is off-set from the template center.

When printing edge fields, the center of pressure of the imprint fluid active on the template is not at the center of the template. FIG. 6 illustrates the case of only a single die imprinted where the pressure center is significantly off-set from the template center. Thus, for the case of Field A of FIG. 4, a significant off-set exists between the center of pressure of the imprinting and the center of the template. Therefore, a passive flexure may lead to tilted imprints where the residual layer thickness varies approximately linearly across the field. Therefore, the imprinting method can use an active flexure wherein the two tilt axes are controlled by voice coils. Alternatively the method can use a three-legged voice coil imprint head as described in United States patent application publication 2006/0005657, filed as U.S. patent application Ser. No. 11/142,825 entitled, "Method and System to Control Movement of a Body for Nano-Scale Manufacturing" and U.S. patent application Ser. No. 11/142,838 entitled "Compliant Device for Nano-Scale Manufacturing" both of which are incorporated herein by reference. In each case, the forces on the voice coils are set asymmetrically to achieve a center of pressure that is different from the center. This allows imprinting of edge fields while obtaining uniform residual layer. The residual layer control can be further improved by using film thickness measurement and feeding it back to adjust the dispense volume.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalent.

The invention claimed is:

1. A method of edge field patterning on a substrate using an imprint lithography system, comprising:
    positioning an imprint lithography template with the substrate such that a portion of the imprint lithography template is in superimposition with the substrate, the imprint lithography template having multiple mesas with each mesa corresponding to a field on the substrate, wherein a portion of the fields on the substrate are full fields and a portion of the fields on the substrate are partial fields;
    depositing polymerizable material between the imprint lithography template and each full field in superimposition with the imprint lithography template;
    depositing a non-reactive liquid between the imprint lithography template and each partial field in superimposition with the imprint lithography template;
    positioning the imprint lithography template toward the substrate;
    solidifying the polymerizable material to provide an edge field pattern on the substrate.

2. The method of claim 1, wherein solidifying the polymerizable material to provide an edge field pattern on the substrate further comprises forming a stepped imprint boundary.

3. The method of claim 1, wherein the fluid area of each partial field in superimposition with the imprint lithography template is defined by the mesa and an edge of the substrate.

4. The method of claim 1, further comprising applying a transfer layer to the substrate prior to depositing the polymerizable material, wherein the transfer layer is used as an adhesion promoter.

5. The method of claim 4, wherein the transfer layer deposited on the substrate is without an edge bead.

6. The method of claim 4, further comprising removing an edge bead from the transfer layer.

7. The method of claim 4, wherein the transfer layer comprises an optically imagable material.

8. The method of claim 4, wherein the transfer layer comprises a positive tone resist.

9. The method of claim 4, wherein the transfer layer comprises a negative tone resist.

10. The method of claim 1, further comprising removing the imprint lithography template and positioning a second imprint lithography template towards the substrate, the second imprint lithography template having multiple mesas with each mesa corresponding to at least one partial field of the substrate.

11. The method of claim 10, wherein the pattern density of the second imprint lithography template is similar to the pattern density of the imprint lithography template.

12. The method of claim 11, wherein features of the second imprint lithography template are greater than approximately 400 nm.

13. The method of claim 1, wherein depositing polymerizable material between the imprint lithography template and each full field in superimposition with the imprint lithography template includes minimizing wetting of portions of the imprint lithography template not in superimposition with the substrate.

14. A method of edge field patterning on a substrate using an imprint lithography system, comprising:
    positioning an imprint lithography template in superimposition with the substrate such that a portion of fields on the substrate are classified as full fields and a portion of the fields on the substrate are classified as partial fields, the imprint lithography template having multiple mesas, each mesa corresponding to at least one field on the substrate;
    depositing polymerizable material between the imprint lithography template and each full field in superimposition with the imprint lithography template;
    depositing non-reactive liquid between the imprint lithography template and each partial field in superimposition with the imprint lithography template;
    contacting the imprint lithography template to the polymerizable material; and,
    solidifying the polymerizable material to provide an edge field pattern on at least one full field of the substrate.

15. The method of claim 14, further comprising applying a transfer layer to the substrate prior to depositing the polymerizable material and non-reactive liquid, wherein the transfer layer is used as an adhesion promoter.

16. The method of claim 15, wherein the transfer layer is deposited without an edge bead.

17. The method of claim 15, further comprising removing an edge bead from the transfer layer.

18. A method comprising:
    depositing a transfer layer on a substrate positioned within an imprint lithography system;
    depositing polymerizable material between full fields of the substrate and an imprint lithography template in superimposition with the substrate, the imprint lithography template having multiple mesas;
    depositing non-reactive liquid between partial fields of the substrate and the imprint lithography template in superimposition with the substrate;
    contacting the imprint lithography template to the polymerizable material; and,
    solidifying the polymerizable material to provide an edge field pattern on at least one full field of the substrate.

19. The method of claim 18, further comprising applying a transfer layer without an edge bead to the substrate prior to depositing the polymerizable material and non-reactive liquid, wherein the transfer layer is used as an adhesion promoter.

* * * * *